US012648306B2

(12) United States Patent
Yun

(10) Patent No.: US 12,648,306 B2
(45) Date of Patent: Jun. 2, 2026

(54) DISPLAY APPARATUS CAPABLE OF REDUCING LEAKAGE CURRENT AND EFFECTIVELY TRANSMITTING ELECTRICAL SIGNAL TO OPPOSITE ELECTRODES

(71) Applicant: Samsung Display Co., Ltd., Yongin-Si (KR)

(72) Inventor: Jonghyun Yun, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 431 days.

(21) Appl. No.: 18/195,403

(22) Filed: May 10, 2023

(65) Prior Publication Data

US 2024/0040843 A1      Feb. 1, 2024

(30) Foreign Application Priority Data

Jul. 26, 2022    (KR) ........................ 10-2022-0092644

(51) Int. Cl.
| | |
|---|---|
| *H10K 59/122* | (2023.01) |
| *H10K 50/81* | (2023.01) |
| *H10K 50/813* | (2023.01) |
| *H10K 50/822* | (2023.01) |
| *H10K 50/842* | (2023.01) |
| *H10K 59/35* | (2023.01) |
| *H10K 59/80* | (2023.01) |

(52) U.S. Cl.
CPC ........... *H10K 59/122* (2023.02); *H10K 50/81* (2023.02); *H10K 50/813* (2023.02); *H10K 50/822* (2023.02); *H10K 50/8428* (2023.02); *H10K 59/353* (2023.02); *H10K 59/80515* (2023.02); *H10K 59/80521* (2023.02); *H10K 59/8723* (2023.02)

(58) Field of Classification Search
CPC ........... H10K 59/122; H10K 59/80515; H10K 59/80521; H10K 59/8428; H10K 50/813; H10K 50/822; H10K 50/8723
See application file for complete search history.

(56) References Cited

U.S. PATENT DOCUMENTS

| | | | |
|---|---|---|---|
| 8,299,478 | B2 | 10/2012 | Chun |
| 10,727,450 | B2 | 7/2020 | Yun et al. |
| 11,217,771 | B2 | 1/2022 | Lee et al. |

(Continued)

FOREIGN PATENT DOCUMENTS

| | | |
|---|---|---|
| KR | 10-1073561 B1 | 10/2011 |
| KR | 10-2018-0076429 A | 7/2018 |

(Continued)

OTHER PUBLICATIONS

Korean Intellectual Property Office, Request for the Submission of an Opinion, Korean Application No. 10-2022-0092644, Jan. 28, 2026, all pages. (Year: 2026).*

*Primary Examiner* — Victoria K. Hall

(74) *Attorney, Agent, or Firm* — Innovation Counsel LLP

(57) ABSTRACT

A display apparatus capable of reducing a leakage current and effectively transmitting an electrical signal to a plurality of opposite electrodes includes a pixel definition layer including a first opening, a spacer including a second opening, wherein at least a portion of a body portion of the spacer is disposed in the first opening to cover a side surface of the pixel defining layer.

18 Claims, 9 Drawing Sheets

(56)  References Cited

U.S. PATENT DOCUMENTS

| | | | |
|---|---|---|---|
| 11,444,131 B2 | 9/2022 | Kim et al. | |
| 2004/0256984 A1* | 12/2004 | Fuchigami | H10K 59/173 |
| | | | 313/506 |
| 2014/0252321 A1* | 9/2014 | Pyon | H10K 59/122 |
| | | | 257/89 |
| 2021/0391397 A1 | 12/2021 | Koo et al. | |
| 2022/0208904 A1* | 6/2022 | Lee | H10K 59/352 |

FOREIGN PATENT DOCUMENTS

| | | | |
|---|---|---|---|
| KR | 10-2021-0018588 A | 2/2021 |
| KR | 10-2021-0155674 A | 12/2021 |
| KR | 10-2394984 B1 | 5/2022 |
| KR | 10-2022-0092222 A | 7/2022 |

* cited by examiner

DISPLAY APPARATUS CAPABLE OF REDUCING LEAKAGE CURRENT AND EFFECTIVELY TRANSMITTING ELECTRICAL SIGNAL TO OPPOSITE ELECTRODES

CROSS-REFERENCE TO RELATED APPLICATION

This application is based on and claims priority under 35 U.S.C. § 119 to Korean Patent Application No. 10-2022-0092644, filed on Jul. 26, 2022, in the Korean Intellectual Property Office, the disclosure of which is incorporated by reference herein in its entirety.

BACKGROUND

1. Field

One or more embodiments relate to display apparatuses.

2. Description of the Related Art

Display apparatuses may visually display data. A display apparatus may be used as a display of a small product such as a mobile phone or may be used as a display of a large product such as a television.

Some layers included in a display apparatus are commonly provided in a plurality of display devices. Thus, when a current is supplied to a display device, a current may also be supplied to another adjacent display device and thus the color purity of the display apparatus may be degraded. In order to solve this problem, the display apparatus may include a separator or the like.

SUMMARY

A display apparatus of the related art requires an additional process to prevent a leakage current. One or more embodiments include a display apparatus capable of reducing a leakage current and minimizing process steps. However, these problems are merely examples and the scope of the disclosure is not limited thereto.

Additional aspects will be set forth in part in the description which follows and, in part, will be apparent from the description, or may be learned by practice of the presented embodiments of the disclosure.

According to one or more embodiments, a display apparatus includes a substrate, a pixel electrode disposed over the substrate, a pixel definition layer including a first opening exposing at least a portion of the pixel electrode, the exposed portion of the pixel electrode including an emission area and a connection area, a spacer disposed over the pixel definition layer and including a second opening exposing at least a portion of the pixel electrode, an emission layer arranged in the emission area, and an opposite electrode disposed over the emission layer and covering at least a portion of the spacer and the pixel definition layer, wherein at least a portion of a body portion of the spacer is disposed in the first opening to cover a side surface of the pixel defining layer.

In an embodiment, the body portion of the spacer may not be arranged in the emission area and may be arranged in the connection area.

In an embodiment, in the connection area, the opposite electrode may cover a side surface of the second opening, and the opposite electrode disposed over the emission layer may be connected through the connection area to the opposite electrode disposed on an upper surface of the spacer.

In an embodiment, in an area other than the connection area, the opposite electrode disposed over the emission layer may be disconnected from the opposite electrode disposed on an upper surface of the spacer.

In an embodiment, a first angle formed between an inner surface of the pixel definition layer defining the first opening and an upper surface of the substrate may be about 60° or more and about 130° or less, and a second angle formed between an inner surface of the spacer defining the second opening and the upper surface of the substrate may be more than about 0° and about 80° or less.

In an embodiment, the first opening may include a main opening having a polygonal shape corresponding to the emission area and a connection opening protruding from a corner of the polygonal shape in an area corresponding to the connection area.

In an embodiment, the first opening may have a circular or polygonal shape in a plan view.

In an embodiment, the second opening may include a main opening having a circular or polygonal shape and the spacer includes a protrusion protruding toward a center of the first opening in an area corresponding to the connection area.

In an embodiment, the connection area may be located at an edge of the first opening.

In an embodiment, one subpixel area may include at least one connection area.

In an embodiment, the spacer and the pixel definition layer may include different materials.

According to one or more embodiments, a display apparatus includes a first pixel electrode and a second pixel electrode arranged apart from each other over a substrate, a pixel definition layer including a $(1\text{-}1)^{th}$ opening exposing at least a portion of the first pixel electrode to define a first emission area and a first connection area and a $(1\text{-}2)^{th}$ opening exposing at least a portion of the second pixel electrode to define a second emission area and a second connection area, a spacer disposed over the pixel definition layer and including a $(2\text{-}1)^{th}$ opening exposing at least a portion of the first pixel electrode and a $(2\text{-}2)^{th}$ opening exposing at least a portion of the second pixel electrode, a first emission layer arranged in the first emission area and a second emission layer arranged in the second emission area, and an opposing electrode disposed over the first emission layer and the second emission layer and at least partially covering the pixel definition layer and the spacer, wherein at least a portion of a body portion of the spacer is arranged in the $(1\text{-}1)^{th}$ opening and the $(1\text{-}2)^{th}$ opening, an inner surface of the pixel definition layer defining the $(1\text{-}1)^{th}$ opening and the $(1\text{-}2)^{th}$ opening forms an obtuse angle with an upper surface of the substrate, and an inner surface of the spacer defining the $(2\text{-}1)^{th}$ opening and the $(2\text{-}2)^{th}$ opening forms an acute angle with the upper surface of the substrate.

In an embodiment, the body portion of the spacer may be arranged in the first connection area and the second connection area.

In an embodiment, through the first connection area and the second connection area, the opposite electrode disposed over the first pixel electrode may be connected to the opposite electrode disposed over the second pixel electrode.

In an embodiment, in an area other than the first connection area and the second connection area, the opposite electrode disposed over the first pixel electrode and the opposite electrode disposed over the second pixel electrode may be disconnected.

In an embodiment, the first connection area may be located at an edge of the $(1\text{-}1)^{th}$ opening, and the second connection area may be located at an edge of the $(1\text{-}2)^{th}$ opening.

In an embodiment, the first connection area may include at least one first connection area disposed over the first pixel electrode, and the second connection area may include at least one second connection area disposed over the second pixel electrode.

In an embodiment, each of the $(1\text{-}1)^{th}$ opening and the $(1\text{-}2)^{th}$ opening may include a main opening having a polygonal shape corresponding to the first emission area and the second emission area and a connection opening protruding from a corner of the polygonal shape corresponding to the first connection area and the second connection area toward a direction away from a center of each of the $(1\text{-}1)^{th}$ opening and the $(1\text{-}2)^{th}$ opening.

In an embodiment, the (1-1)th opening and the (1-2)th opening may have a circular or polygonal shape.

In an embodiment, the spacer and the pixel definition layer may include different materials.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 5 is a cross-sectional view schematically illustrating a cross-section taken along line II-II' of FIG. 3;

FIG. 9 is a cross-sectional view schematically illustrating a cross-section taken along line III-III' of FIG. 6.

DETAILED DESCRIPTION

Figure 1:
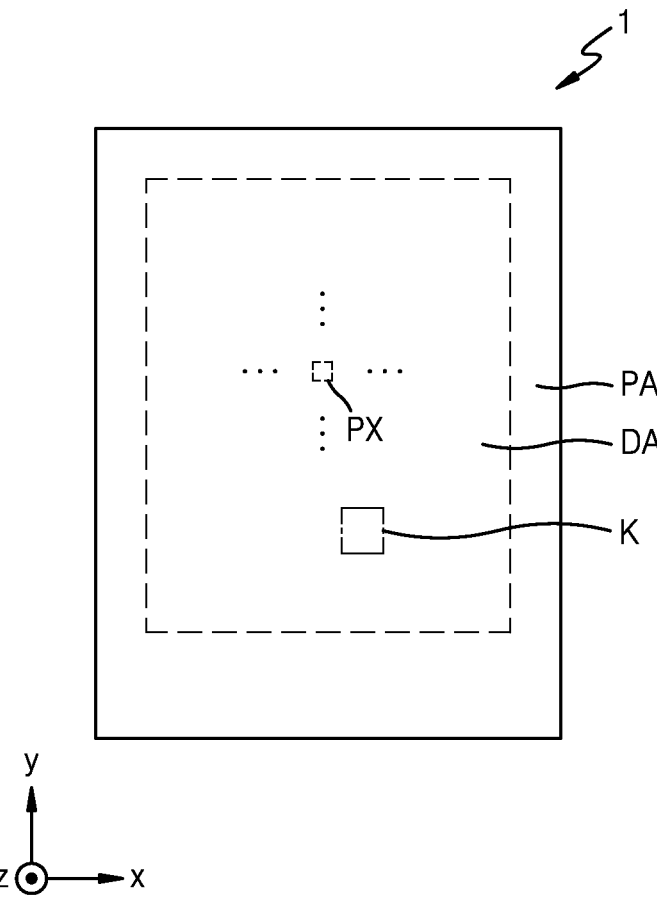
FIG. 1 is a plan view schematically illustrating a portion of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure may include various embodiments and modifications, and certain embodiments thereof are illustrated in the drawings and will be described herein in detail. The effects and features of the disclosure and the accomplishing methods thereof will become apparent from the embodiments described below in detail with reference to the accompanying drawings. However, the disclosure is not limited to the embodiments described below and may be embodied in various modes.

Hereinafter, embodiments will be described in detail with reference to the accompanying drawings, and in the following description, like reference numerals will denote like elements and redundant descriptions thereof will be omitted for brevity.

It will be understood that although terms such as "first" and "second" may be used herein to describe various elements, these elements should not be limited by these terms and these terms are only used to distinguish one element from another element.

As used herein, the singular forms "a," "an," and "the" are intended to include the plural forms as well, unless the context clearly indicates otherwise.

It will be understood that terms such as "comprise," "include," and "have" used herein specify the presence of stated features or elements, but do not preclude the presence or addition of one or more other features or elements.

It will be understood that when a layer, region, area, component, or element is referred to as being "on" another layer, region, area, component, or element, it may be "directly on" the other layer, region, area, component, or element or may be "indirectly on" the other layer, region, area, component, or element with one or more intervening layers, regions, areas, components, or elements therebetween.

Also, herein, the x axis, the y axis, and the z axis are not limited to three axes of the rectangular coordinate system and may be interpreted in a broader sense. For example, the x axis, the y axis, and the z axis may be perpendicular to one another or may represent different directions that are not perpendicular to one another.

Sizes of elements in the drawings may be exaggerated for convenience of description. In other words, because the sizes and thicknesses of elements in the drawings are arbitrarily illustrated for convenience of description, the disclosure is not limited thereto.

When a certain embodiment may be implemented differently, a particular process order may be performed differently from the described order. For example, two consecutively described processes may be performed substantially at the same time or may be performed in an order opposite to the described order.

It will be understood that when a layer, region, or component is referred to as being "connected to" another layer, region, or component, it may be "directly connected to" the other layer, region, or component or may be "indirectly connected to" the other layer, region, or component with one or more intervening layers, regions, or components therebetween. For example, it will be understood that when a layer, region, area, component, or element is referred to as being "electrically connected to" another layer, region, area, component, or element, it may be "directly electrically connected to" the other layer, region, area, component, or element or may be "indirectly electrically connected to" the other layer, region, area, component, or element with one or more intervening layers, regions, areas, components, or elements therebetween.

Display apparatuses may be apparatuses displaying images and may be portable mobile apparatuses such as game machines, multimedia apparatuses, or ultra-compact PCs. Display apparatuses described below may include liquid crystal displays, electrophoretic displays, organic light emitting displays, inorganic EL displays (inorganic light emitting displays), field emission displays, surfaceconduction electron-emitter displays, quantum dot displays, plasma displays, and cathode ray displays. Hereinafter, an organic light emitting display apparatus will be described as an example of as a display apparatus according to an embodiment; however, various display apparatuses described above may be used in embodiments.

FIG. 1 is a plan view schematically illustrating a portion of a display apparatus 1 according to an embodiment.

As illustrated in FIG. 1, the display apparatus 1 may include a display area DA in which a plurality of pixels PX are arranged and a peripheral area PA located outside the display area DA. Particularly, the peripheral area PA may entirely surround the display area DA. It may be understood that a substrate 100 (see FIG. 4) included in the display apparatus includes the display area DA and the peripheral area PA.

Each pixel PX of the display apparatus 1 may be an element capable of emitting light of a certain color, and the display apparatus 1 may provide an image by using light emitted from the pixels PX. For example, each pixel PX may emit red light, green light, or blue light.

The display area DA may have a polygonal shape including a tetragonal shape as illustrated in FIG. 1. For example, the display area DA may have a rectangular shape in which the horizontal length is greater than the vertical length, may have a rectangular shape in which the horizontal length is less than the vertical length, or may have a square shape. Alternatively, the display area DA may have various shapes such as an elliptical shape or a circular shape.

The peripheral area PA may be a non-display area in which pixels PX are not arranged. A driver or the like for providing an electrical signal or power to the pixels PX may be arranged in the peripheral area PA. The peripheral area PA may include pads (not illustrated) to which various electronic devices, printed circuit boards, or the like may be electrically connected. The pads may be arranged apart from each other in the peripheral area PA and may be electrically connected to a printed circuit board or an integrated circuit device.

Figure 2:
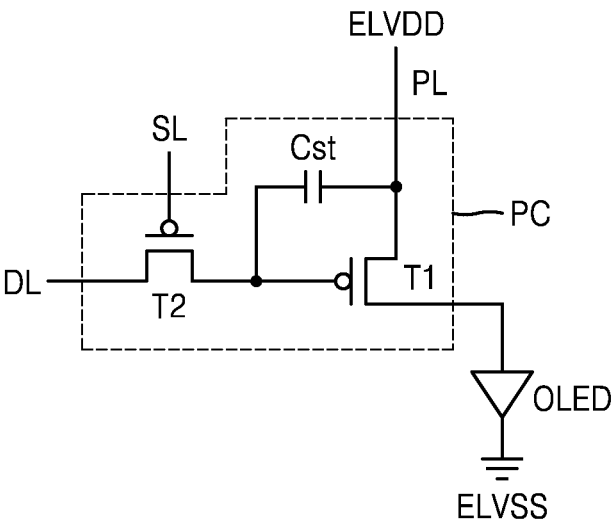
FIG. 2 is an equivalent circuit diagram of a pixel included in the display apparatus of FIG. 1.

FIG. 2 is an equivalent circuit diagram of a pixel PX included in the display apparatus 1 of FIG. 1. As illustrated in FIG. 2, the pixel PX may include a pixel circuit PC and an organic light emitting diode OLED electrically connected thereto.

The pixel circuit PC may include a first transistor T1, a second transistor T2, and a storage capacitor Cst. As a switching transistor, the second transistor T2 may be connected to a scan line SL and a data line DL and may be turned on by a switching signal input from the scan line SL to transmit a data signal input from the data line DL to the first transistor T1. One end of the storage capacitor Cst may be electrically connected to the second transistor T2 and the other end thereof may be electrically connected to a driving voltage line PL, and the storage capacitor Cst may store a voltage corresponding to the difference between a voltage received from the second transistor T2 and a driving power voltage ELVDD supplied from the driving voltage line PL.

As a driving transistor, the first transistor T1 may be connected to the driving voltage line PL and the storage capacitor Cst and may control the level of a driving current flowing from the driving voltage line PL to the organic light emitting diode OLED in response to a voltage value stored in the storage capacitor Cst. The organic light emitting diode OLED may emit light with a certain brightness according to the driving current. An opposite electrode of the organic light emitting diode OLED may be supplied with an electrode power voltage ELVSS.

Although FIG. 2 illustrates that the pixel circuit PC includes two transistors and one storage capacitor, the disclosure is not limited thereto. The number of transistors and the number of storage capacitors may be variously modified according to the design of the pixel circuit PC.

Figure 3:
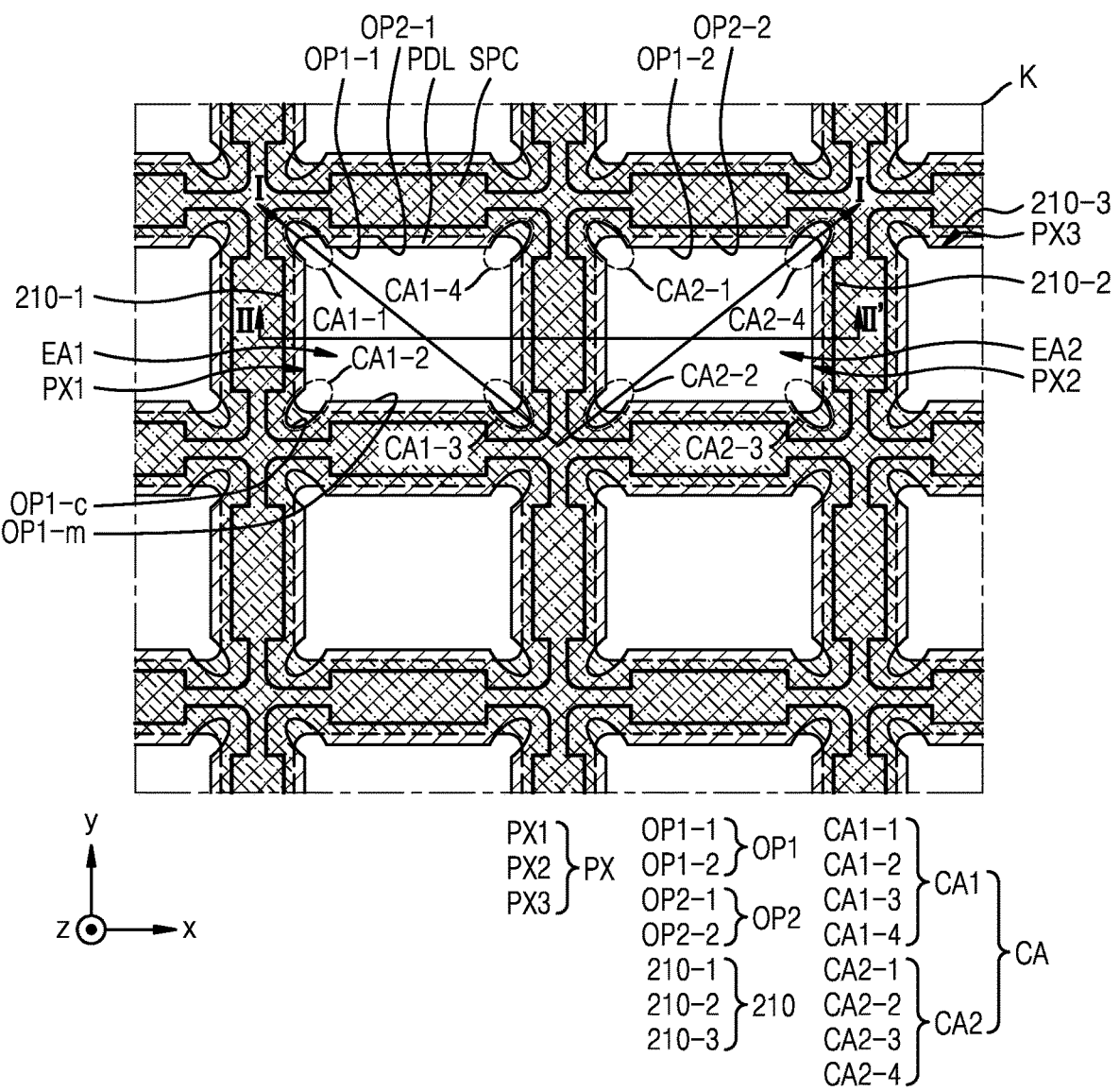
FIG. 3 is an enlarged plan view schematically illustrating region K of the display apparatus of FIG. 1.

FIG. 3 is an enlarged plan view schematically illustrating region K of the display apparatus 1 of FIG. 1.

As illustrated in FIG. 3, a plurality of pixels PX may be arranged in the display area DA of the substrate 100. Each of the pixels PX may refer to a subpixel and may include a display device such as an organic light emitting diode OLED. For example, the pixel PX may emit green light, red light, or blue light. For example, the pixel PX may be a first pixel PX1 emitting green light, a second pixel PX2 emitting red light, or a third pixel PX3 emitting blue light. The green light may be light belonging to a wavelength band of about 495 nm to about 580 nm, the red light may be light belonging to a wavelength band of about 580 nm to about 780 nm, and the blue light may be light belonging to a wavelength band of about 400 nm to about 495 nm.

A plurality of pixel electrodes 210 may be arranged in the display area DA. The plurality of pixel electrodes 210 may include a first pixel electrode 210-1 included in the first pixel PX1, a second pixel electrode 210-2 included in the second pixel PX2, and a third pixel electrode 210-3 included in the third pixel PX3. For example, the first pixel electrode 210-1, the second pixel electrode 210-2, and the third pixel electrode 210-3 may be arranged apart from each other in the plan view. The first pixel electrode 210-1, the second pixel electrode 210-2, and the third pixel electrode 210-3 may have the same size as illustrated in FIG. 3. In other embodiments, the first pixel electrode 210-1, the second pixel electrode 210-2, and the third pixel electrode 210-3 may have different sizes. Hereinafter, the description of the third pixel PX3 will be omitted for brevity.

A pixel definition layer PDL may be disposed over the pixel electrode 210 and may include a first opening OP1 exposing at least a portion of the pixel electrode 210. The first opening OP1 may expose a central portion of the pixel electrode 210.

The pixel definition layer PDL may define an emission area EA and a connection area CA through the first opening OP1. The emission area EA may include a central portion of the first opening OP1. The connection area CA may be located at an edge of the first opening OP1. The connection area CA may be located farthest from a center of the pixel PX. The emission area EA may partially overlap the connection area CA. The connection area CA may be provided as at least one connection area in one subpixel area.

In an embodiment, the first opening OP1 may include a main opening OP1-m corresponding to the emission area EA and a connection opening OP1-c corresponding to the connection area CA. The main opening OP1-m may have a polygonal shape corresponding to the emission area EA. The connection opening OP1-c may have a shape protruding from a corner of the polygonal shape toward a direction opposite to a center of the main opening OP1-m.

The first opening OP1 may include a (1-1)th opening OP1-1 disposed over the first pixel electrode 210-1 and a (1-2)th opening OP1-2 disposed over the second pixel electrode 210-2. In an embodiment, the (1-1)th opening OP1-1 may define a first emission area EA1 and a first connection area CA1. The (1-2)th opening OP1-2 may define a second emission area EA2 and a second connection area CA2.

The first connection area CA1 and the second connection area CA2 may be respectively provided as a plurality of first connection areas and a plurality of second connection areas. For example, the first connection area CA1 may include a (1-1)th connection area CA1-1, a (1-2)th connection area CA1-2, a (1-3)th connection area CA1-3, and a (1-4)th connection area CA1-4. Likewise, the second connection area CA2 may include a (2-1)th connection area CA2-1, a (2-2)th connection area CA2-2, a (2-3)th connection area CA2-3, and a (2-4)th connection area CA2-4.

The (1-1)th opening OP1-1 and the (1-2)th opening OP1-2 may have the same size as illustrated in FIG. 3. In other embodiments, the (1-1)th opening OP1-1 and the (1-2)th opening OP1-2 may have different sizes.

Although not illustrated in FIG. 3, an emission layer (not illustrated) emitting light may be located in the first opening OP1 of the pixel definition layer PDL. An opposite electrode 230 may be disposed over the emission layer. A stack structure of the pixel electrode 210, the emission layer, and the opposite electrode 230 may form an organic light emitting diode OLED. An opening of the pixel definition layer PDL may correspond to an area in which the organic light emitting diode OLED is disposed.

A spacer SPC may be disposed over the pixel definition layer PDL. The spacer SPC may be disposed over the pixel electrode 210 and may include a second opening OP2 exposing at least a portion of the pixel electrode 210. The second opening OP2 may expose a central portion of the pixel electrode 210. As illustrated in FIG. 3, the second opening OP2 may have a polygonal shape including a tetragonal shape in the plan view. In other embodiments, the second opening OP2 may have a circular shape or an atypical shape.

The second opening OP2 may include a $(2-1)^{th}$ opening OP2-1 disposed over the first pixel electrode 210-1 and a $(2-2)^{th}$ opening OP2-2 disposed over the second pixel electrode 210-2. The $(2-1)^{th}$ opening OP2-1 and the $(2-2)^{th}$ opening OP2-2 may have the same size as illustrated in FIG. 3. In other embodiments, the $(2-1)^{th}$ opening OP2-1 and the $(2-2)^{th}$ opening OP2-2 may have different sizes.

A portion of a body portion of the spacer SPC may be arranged in the first opening OP1. The body portion of the spacer SPC may be arranged in the connection opening OP1-c of the pixel definition layer PDL. The inside of the first opening OP1 in which the body portion of the spacer SPC is arranged may overlap the connection area CA. In other words, a portion of the body portion of the spacer SPC may be arranged in the connection area CA. The body portion of the spacer SPC may not be arranged in the emission area EA.

Figure 4:
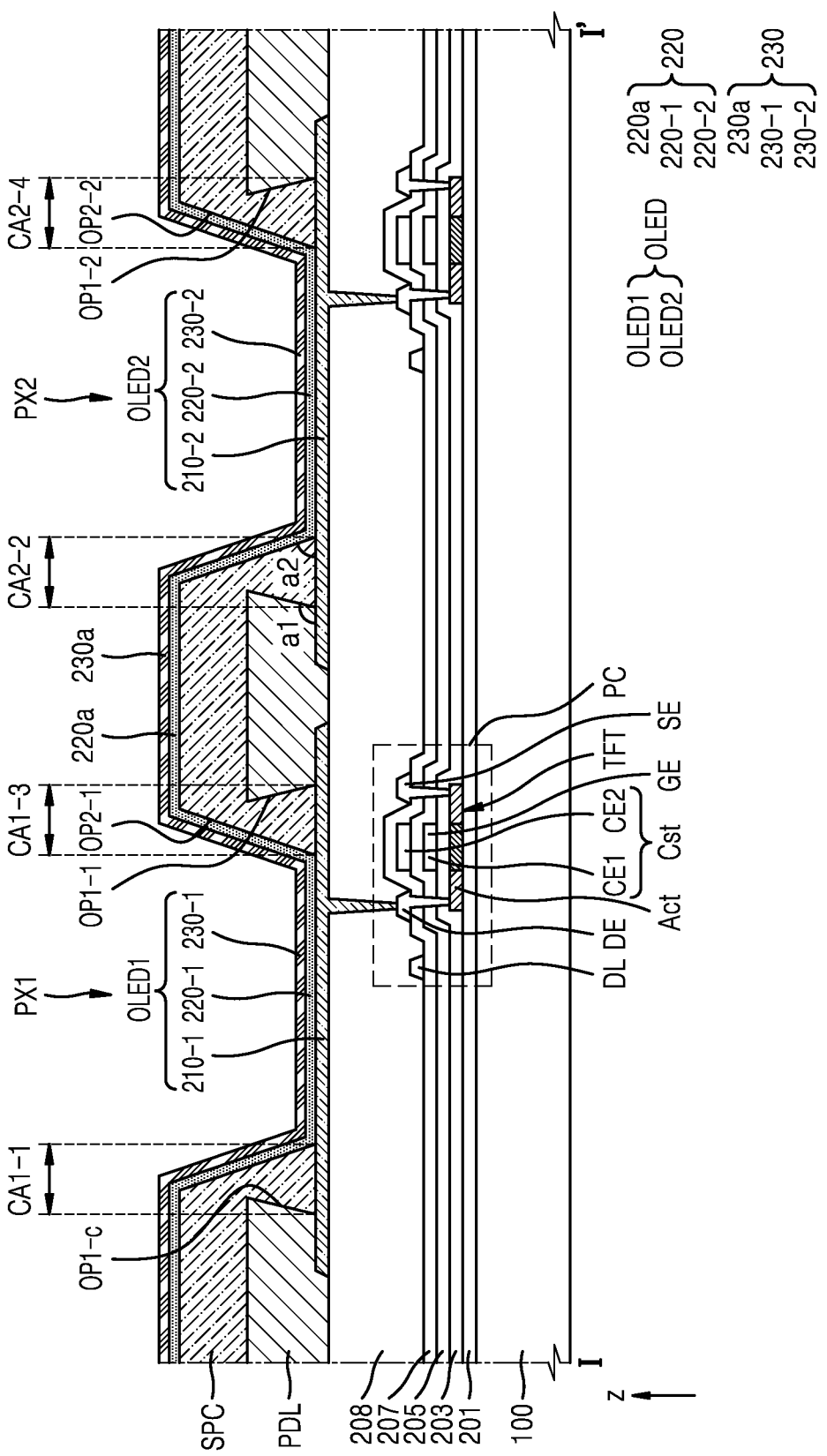
FIG. 4 is a cross-sectional view schematically illustrating a cross-section taken along line I-I' of FIG. 3.

A second angle a2 (see FIG. 4) formed between the inner surface of the spacer SPC defining the second opening OP2 and the substrate 100 (see FIG. 4) may be smaller than a first angle a1 (see FIG. 4) formed between the inner surface of the pixel definition layer PDL defining the first opening OP1 and the substrate 100 (see FIG. 4). Details thereof will be described below through cross-sectional views.

FIG. 4 is a cross-sectional view schematically illustrating a cross-section taken along line I-I' of FIG. 3.

As illustrated in FIG. 4, the display apparatus according to the present embodiment may include a substrate 100. The substrate 100 may include various materials having flexible or bendable characteristics. For example, the substrate 100 may include glass, metal, or polymer resin.

Also, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. However, the substrate 100 may be variously modified such as including a multilayer structure including two layers including the polymer resin and a barrier layer located between the two layers and including an inorganic material (e.g., silicon oxide, silicon nitride, or silicon oxynitride).

Pixels PX including a display element and a pixel circuit PC may be disposed over the substrate 100. FIG. 4 illustrates that the pixels PX include an organic light emitting diode OLED as a display element. For example, the organic light emitting diode OLED may be a first organic light emitting diode OLED1 or a second organic light emitting diode OLED2. That is, the first pixel PX1 may include a first organic light emitting diode OLED1, and the second pixel PX2 may include a second organic light emitting diode OLED2.

A pixel circuit PC may be disposed over the substrate 100. Because the structures of the pixel circuits PC of the pixels PX are the same as each other, one pixel circuit PC will be mainly described. The pixel circuit PC may include a plurality of thin film transistors TFT and a storage capacitor Cst. For convenience of illustration, FIG. 4 illustrates one thin film transistor TFT, and the thin film transistor TFT may correspond to the driving thin film transistor T1 (see FIG. 2) described above.

A buffer layer 201 including an inorganic material such as silicon oxide, silicon nitride, and/or silicon oxynitride may be arranged between the thin film transistor TFT and the substrate 100. The buffer layer 201 may function to increase the smoothness of the upper surface of the substrate 100 or to prevent or minimize the penetration of impurities into a semiconductor layer Act of the thin film transistor TFT from the substrate 100 or the like.

As illustrated in FIG. 4, the thin film transistor TFT may include a semiconductor layer Act including amorphous silicon, polycrystalline silicon, an organic semiconductor material, or an oxide semiconductor material. Also, the thin film transistor TFT may include a gate electrode GE, a source electrode SE, and/or a drain electrode DE. The gate electrode GE may include various conductive materials and may have various layered structures, for example, may include a Mo layer and an Al layer. Alternatively, the gate electrode GE may include a $TiN_x$ layer, an Al layer, and/or a Ti layer. The source electrode SE and the drain electrode DE may also include various conductive materials and may have various layered structures, for example, may include a Ti layer, an Al layer, and/or a Cu layer.

In order to secure the insulation between the semiconductor layer Act and the gate electrode GE, a gate insulating layer 203 including an inorganic material such as silicon oxide, silicon nitride, and/or silicon oxynitride may be located between the semiconductor layer Act and the gate electrode GE. FIG. 4 illustrates that the gate insulating layer 203 has a shape corresponding to the entire surface of the substrate 100 and has a structure in which contact holes are formed in a preset portion; however, the disclosure is not limited thereto. For example, the gate insulating layer 203 may be patterned to have the same shape as the gate electrode GE.

Also, a first interlayer insulating layer 205 including an inorganic material such as silicon oxide, silicon nitride, and/or silicon oxynitride may be disposed over the gate electrode GE. The first interlayer insulating layer 205 may have a single-layer or multiple-layer structure including the above material. As such, an insulating layer including an inorganic material may be formed through chemical vapor deposition (CVD) or atomic layer deposition (ALD). This may also apply to the following embodiments and modifications thereof.

The storage capacitor Cst may include a first electrode CE1 and a second electrode CE2 overlapping each other with the first interlayer insulating layer 205 disposed therebetween. The storage capacitor Cst may overlap the thin film transistor TFT. In this regard, FIG. 4 illustrates that the gate electrode GE of the thin film transistor TFT is the first electrode CE1 of the storage capacitor Cst; however, the disclosure is not limited thereto. For example, the storage capacitor Cst may not overlap the thin film transistor TFT. The second electrode CE2 of the storage capacitor Cst may include a conductive material including molybdenum (Mo), aluminum (Al), copper (Cu), titanium (Ti), or the like and may have a multiple-layer or single-layer structure including the above material.

A second interlayer insulating layer 207 including an inorganic material such as silicon oxide, silicon nitride, and/or silicon oxynitride may be disposed over the second electrode CE2 of the storage capacitor Cst. The second interlayer insulating layer 207 may have a single-layer or multiple-layer structure including the above material.

The source electrode SE and the drain electrode DE may be disposed over the second interlayer insulating layer 207. The data line DL may be located on the same layer and may include the same material as the source electrode SE and the drain electrode DE. The source electrode SE, the drain electrode DE, and the data line DL may include a material having high conductivity. The source electrode SE and the drain electrode DE may include a conductive material including molybdenum (Mo), aluminum (Al), copper (Cu), titanium (Ti), or the like and may have a multiple-layer or single-layer structure including the above material. For example, the source electrode SE, the drain electrode DE, and the data line DL may have a multilayer structure of Ti/Al/Ti.

However, the disclosure is not limited thereto. For example, the thin film transistor TFT may include only one of the source electrode SE and the drain electrode DE or may not include both of them. For example, a thin film transistor TFT may not include the drain electrode DE, another thin film transistor TFT connected to the thin film transistor TFT may not include the source electrode SE, and the semiconductor layers Act of the two thin film transistors may be connected to each other. This connection structure may provide the same effect as a case where a thin film transistor TFT also includes the source electrode SE, another thin film transistor TFT also includes the drain electrode DE, and the source electrode SE of the thin film transistor TFT is connected to the drain electrode DE of the other thin film transistor TFT.

As illustrated in FIG. 4, a planarization layer 208 may be arranged to cover the thin film transistor TFT and the storage capacitor Cst. The planarization layer 208 may include an organic insulating material. For example, the planarization layer 208 may include a photoresist, benzocyclobutene (BCB), polyimide, hexamethyldisiloxane (HMDSO), polymethylmethacrylate (PMMA), polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, or any mixture thereof.

Although not illustrated in FIG. 4, a third interlayer insulating layer (not illustrated) may be further disposed under the planarization layer 208. The third interlayer insulating layer may include an inorganic insulating material such as silicon oxide, silicon nitride, or silicon oxynitride.

The first organic light emitting diode OLED1 and the second organic light emitting diode OLED2 may be disposed apart from each other over the planarization layer 208.

The first pixel electrode 210-1 and the second pixel electrode 210-2 may be disposed apart from each other over the planarization layer 208. The first pixel electrode 210-1 and the second pixel electrode 210-2 may include a transparent conductive layer formed of a transparent conductive oxide such as ITO, $In_2O_3$, or IZO, and a reflective layer formed of a metal such as Al or Ag. For example, the first pixel electrode 210-1 and the second pixel electrode 210-2 may have a three-layer structure of ITO/Ag/ITO.

As illustrated in FIG. 4, the first pixel electrode 210-1 and the second pixel electrode 210-2 may be electrically connected to the thin film transistor TFT by contacting any one of the source electrode SE and the drain electrode DE. Particularly, each of the first pixel electrode 210-1 and the second pixel electrode 210-2 may contact any one of the source electrode SE and the drain electrode DE through a contact hole formed in the planarization layer 208.

A pixel definition layer PDL may be disposed over the planarization layer 208. The pixel definition layer PDL may define a pixel PX by including a first opening OP1 exposing at least a portion of the pixel electrode 210.

The pixel definition layer PDL may include a first opening OP1. The first opening OP1 may include a (1-1)th opening OP1-1 disposed over the first pixel electrode 210-1 and a (1-2)th opening OP1-2 disposed over the second pixel electrode 210-2. In an embodiment, the (1-1)th opening OP1-1 may define a first emission area EA1 and a first connection area CA1. The (1-2)th opening OP1-2 may define a second emission area EA2 and a second connection area CA2.

The first connection area CA1 and the second connection area CA2 may be located at corners of the first opening OP1. The first connection area CA1 and the second connection area CA2 may be respectively provided as a plurality of first connection areas and a plurality of second connection areas. For example, the first connection area CA1 may include a $(1\text{-}1)^{th}$ connection area CA1-1, a $(1\text{-}2)^{th}$ connection area CA1-2, a $(1\text{-}3)^{th}$ connection area CA1-3, and a $(1\text{-}4)^{th}$ connection area CA1-4. The second connection area CA2 may include a $(2\text{-}1)^{th}$ connection area CA2-1, a $(2\text{-}2)^{th}$ connection area CA2-2, a $(2\text{-}3)^{th}$ connection area CA2-3, and a $(2\text{-}4)^{th}$ connection area CA2-4. FIG. 4 illustrates a cross-section of the $(1\text{-}1)^{th}$ connection area CA1-1, the $(1\text{-}3)^{th}$ connection area CA1-3, the $(2\text{-}2)^{th}$ connection area CA2-2, and the $(2\text{-}4)^{th}$ connection area CA2-4.

The pixel definition layer PDL may increase the distance between edges of the pixel electrode 210 and the opposite electrode 230 disposed over the pixel electrode 210. Accordingly, an arc or the like may be prevented from occurring at the edges of the pixel electrode 210. The pixel definition layer PDL may include, for example, an organic material such as polyimide or hexamethyldisiloxane (HMDSO). In some embodiments, the pixel definition layer PDL may include a light blocking material and may be provided in black. The light blocking material may include, for example, a resin or paste including carbon black, carbon nanotube, or black dye, metal particles (e.g., nickel, aluminum, molybdenum, or any alloy thereof), metal oxide particles (e.g., chromium oxide), or metal nitride particles (e.g., chromium nitride). When the pixel definition layer PDL includes a light blocking material, the reflection of external light by metal structures disposed under the pixel definition layer PDL may be reduced.

Referring to FIG. 4, in an embodiment, a first angle a1 formed between the inner surface of the pixel definition layer PDL defining the first opening OP1 and the upper surface of the substrate 100 may be about 60° or more and about 130° or less.

A spacer SPC may be disposed over the pixel definition layer PDL. The spacer SPC may include a second opening OP2 exposing at least a portion of the pixel electrode 210. The second opening OP2 may include a $(2\text{-}1)^{th}$ opening OP2-1 exposing at least a portion of the first pixel electrode 210-1 and a $(2\text{-}2)^{th}$ opening OP2-2 exposing at least a portion of the second pixel electrode 210-2.

A portion of a body portion of the spacer SPC may be arranged in the first opening OP1 of the pixel definition layer PDL. The body portion of the spacer SPC may be arranged in the connection opening OP1-c included in the first opening OP1. The inside of the first opening OP1 in which the body portion of the spacer SPC is arranged may overlap the connection area CA.

Referring to FIG. 4, a portion of the body portion of the spacer SPC may be arranged in the $(1\text{-}1)^{th}$ connection area CA1-1, the $(1\text{-}3)^{th}$ connection area CA1-3, the $(2\text{-}2)^{th}$ connection area CA2-2, and the $(2\text{-}4)^{th}$ connection area CA2-4.

In an embodiment, the spacer SPC may include a different material than the pixel definition layer PDL. For example, the pixel definition layer PDL and the spacer SPC may include different materials (e.g., the pixel definition layer PDL may include a negative photosensitive material and the spacer SPC may include a positive photosensitive material) and may be respectively formed through separate mask processes. The spacer SPC may include a transparent insulating layer.

Referring to FIG. 4, a second angle a2 formed between the inner surface of the spacer SPC defining the second opening OP2 and the substrate 100 may be smaller than a first angle a1 formed between the inner surface of the pixel definition layer PDL defining the first opening OP1 and the substrate 100. The second angle a2 may be more than about 0° and about 80° or less. Accordingly, the opposite electrode 230 described below may cover the side surface of the second opening OP2 of the spacer SPC in the connection area CA, and the opposite electrodes 230 of adjacent pixels PX may be connected to each other through the opposite electrode 230 disposed in the connection area CA.

A first intermediate layer 220-1 may be disposed over the first pixel electrode 210-1. A second intermediate layer 220-2 may be disposed over the second pixel electrode 210-2. The first intermediate layer 220-1 and the second intermediate layer 220-2 may include a low molecular weight or high molecular weight material. The first intermediate layer 220-1 may include a first emission layer. The first emission layer may be arranged only in the $(1\text{-}1)^{th}$ opening OP1-1. The second intermediate layer 220-2 may include a second emission layer. The second emission layer may be arranged only in the $(1\text{-}2)^{th}$ opening OP1-2.

When the first intermediate layer 220-1 and the second intermediate layer 220-2 include a low molecular weight material, the first intermediate layer 220-1 and the second intermediate layer 220-2 may have a structure in which a hole injection layer (HIL), a hole transport layer (HTL), an emission layer (EML), an electron transport layer (ETL), an electron injection layer (EIL), and the like are stacked in a single or complex structure and may be formed by vacuum deposition.

When the first intermediate layer 220-1 and the second intermediate layer 220-2 include a high molecular weight material, the first intermediate layer 220-1 and the second intermediate layer 220-2 may have a structure including a hole transport layer (HTL) and an emission layer (EML). In this case, the hole transport layer (HTL) may include poly (3,4-ethylenedioxythiophene) (PEDOT) and the emission layer (EML) may include a high molecular weight material such as polyphenylene vinylene (PPV) and polyfluorene. The first intermediate layer 220-1 and the second intermediate layer 220-2 may be formed by screen printing, inkjet printing, laser induced thermal imaging (LITI), or the like.

A first opposite electrode 230-1 may be disposed over the first intermediate layer 220-1. A second opposite electrode 230-2 may be disposed over the second intermediate layer 220-2. That is, the first intermediate layer 220-1 may be arranged between the first pixel electrode 210-1 and the first opposite electrode 230-1, and the second intermediate layer 220-2 may be arranged between the second pixel electrode 210-2 and the second opposite electrode 230-2.

The first opposite electrode 230-1 and the second opposite electrode 230-2 may include a transparent conductive layer formed of ITO, $In_2O_3$, or IZO and may also include a semitransparent layer including a metal such as Al or Ag. For example, the first opposite electrode 230-1 and the second opposite electrode 230-2 may include a semitransparent layer including Mg or Ag. Although not illustrated in FIG. 4, a capping layer (not illustrated) may be disposed over the first opposite electrode 230-1 and the second opposite electrode 230-2. For example, the capping layer may be provided as a single layer or multiple layers including a material selected from an organic material, an inorganic material, and a mixture thereof. In an alternative embodiment, a LiF layer may be located over the capping layer. Moreover, the first opposite electrode 230-1 and the second opposite electrode 230-2 may be simultaneously formed of the same material through the same process. Particularly, a material forming the first opposite electrode 230-1 and the second opposite electrode 230-2 may be deposited on the entire surface of the substrate 100.

The opposite electrode 230 may cover at least a portion of the spacer SPC and the pixel definition layer PDL. Because the body portion of the spacer SPC is arranged in the first opening OP1 of the pixel definition layer PDL in the connection area CA, the opposite electrode 230 may be disposed over the spacer SPC in the $(1\text{-}1)^{th}$ connection area CA1-1, the $(1\text{-}3)^{th}$ connection area CA1-3, the $(2\text{-}2)^{th}$ connection area CA2-2, and the $(2\text{-}4)^{th}$ connection area CA2-4 as illustrated in FIG. 4.

Because the second angle a2 of the spacer SPC may be provided as an acute angle, the opposite electrode 230 may cover the side surface of the spacer SPC. Accordingly, the first opposite electrode 230-1 may be connected in the first connection area CA1 to a residual opposite electrode 230*a* disposed on the upper surface of the spacer SPC. The second opposite electrode 230-2 may be connected in the second connection area CA2 to the residual opposite electrode 230*a* disposed on the upper surface of the spacer SPC. Also, the first opposite electrode 230-1 may be connected to the second opposite electrode 230-2 in the first connection area CA1 and the second connection area CA2.

As such, because opposite electrodes 230 arranged in a plurality of pixels PX may be connected to each other in the connection area CA, the display apparatus 1 may effectively transmit an electrical signal to the opposite electrodes 230.

In general, because opposite electrodes included in a plurality of display devices are integrally formed over the entire surface of the display area DA, the opposite electrodes included in the plurality of display devices may be electrically connected to each other. The same electrical signal may be supplied to the plurality of display devices through the integrally formed opposite electrodes. For example, the same electrode power voltage ELVSS may be supplied to the plurality of display devices through the integrally formed opposite electrodes. Thus, the integrally formed opposite electrodes may function as a line for supplying the electrode power voltage ELVSS to the display devices.

Moreover, according to the disclosure, by connecting the opposite electrodes 230 in the connection area CA described above, the electrode power voltage ELVSS may be supplied to the display devices.

Figure 5:
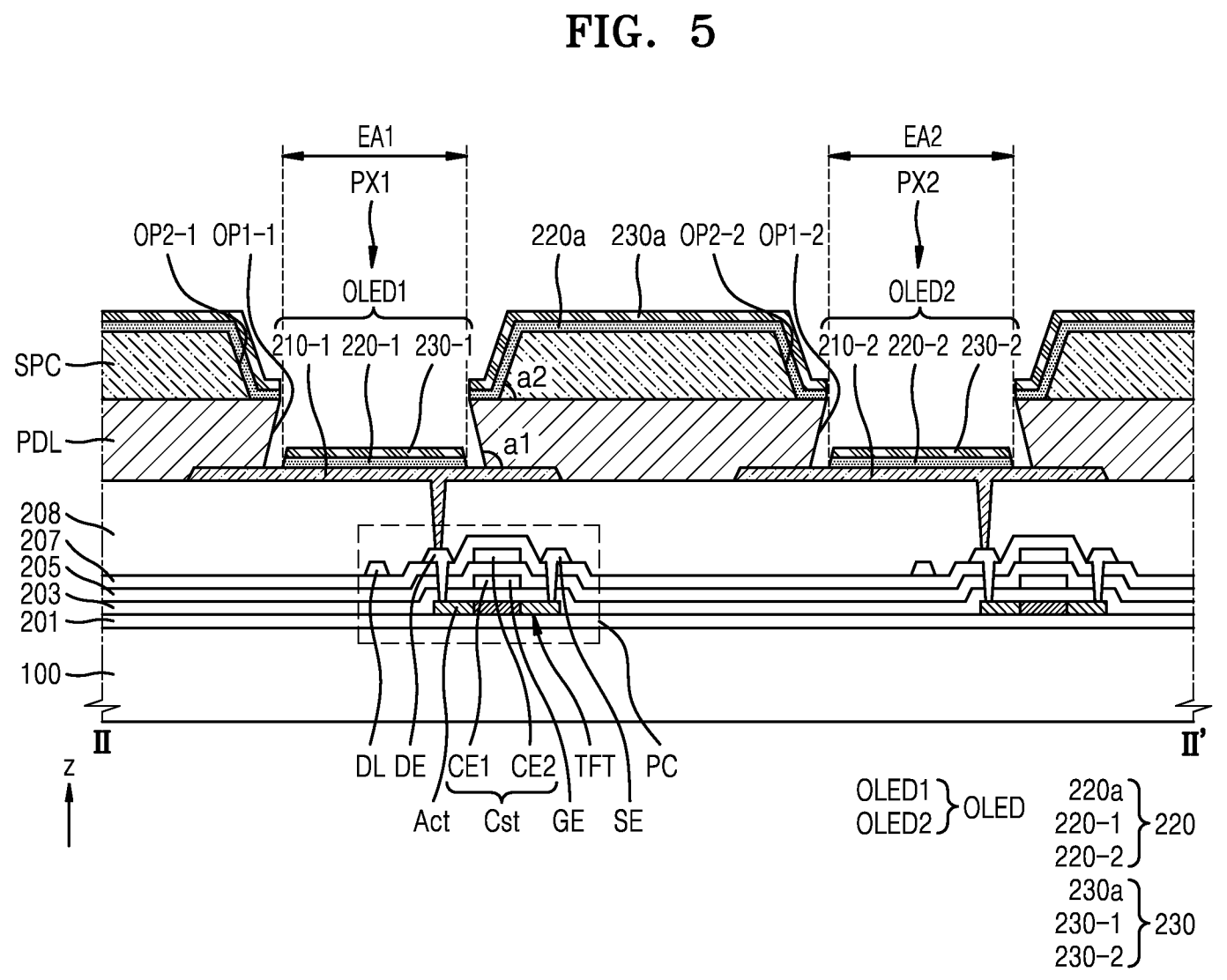

FIG. 5 is a cross-sectional view schematically illustrating a cross-section taken along line II-II' of FIG. 3. Hereinafter, differences from the illustration of FIG. 4 will be mainly described, and redundant descriptions of the same configuration will be omitted for brevity.

Referring to FIG. 5, the first organic light emitting diode OLED1 and the second organic light emitting diode OLED2 may be disposed apart from each other over the planarization layer 208. The first pixel electrode 210-1 and the second pixel electrode 210-2 may be disposed apart from each other over the planarization layer 208.

A first intermediate layer 220-1 may be disposed over the first pixel electrode 210-1. A second intermediate layer 220-2 may be disposed over the second pixel electrode 210-2. The first intermediate layer 220-1 and the second intermediate layer 220-2 may include a low molecular weight or high molecular weight material.

In an embodiment, the first intermediate layer 220-1 of the first organic light emitting diode OLED1 may include a $(1\text{-}1)^{th}$ common layer, a first emission layer, and a $(2\text{-}1)^{th}$ common layer. The first emission layer may include a high molecular weight or low molecular weight organic material for emitting a certain color. The second intermediate layer 220-2 of the second organic light emitting diode OLED2 may include a $(1\text{-}2)^{th}$ common layer, a second emission layer, and a $(2\text{-}2)^{th}$ common layer.

The first emission layer and the second emission layer may emit light of a certain wavelength band. For example, the first emission layer and the second emission layer may emit green, red, or blue light. The second emission layer of the second organic light emitting diode OLED2 may emit light of a different wavelength band than the first emission layer of the first organic light emitting diode OLED1.

The organic light emitting diode OLED may have a tandem structure. Particularly, the organic light emitting diode OLED may include a lower emission layer and an upper emission layer, and the upper emission layer may be disposed over the lower emission layer to overlap the lower emission layer. That is, the emission layer may include a lower emission layer and an upper emission layer.

A first common layer may be arranged between the pixel electrode 210 and the lower emission layer. The first common layer may have a single-layer or multiple-layer structure. For example, when the first common layer is formed of a high molecular weight material, the first common layer may be a hole transport layer (HTL) of a single-layer structure and may be formed of poly(3,4-ethylenedioxythiophene) (PEDOT), polyaniline (PANI), N,N'-diphenyl-N,N'-bis(3-methylphenyl)-1,1'-bi-phenyl-4,4'-diamine (TPD), or N,N'-di(naphthalen-1-yl)-N,N'-diphenyl-benzidine (NPB). When the first common layer is formed of a low molecular weight material, the first common layer may include a hole injection layer (HIL) and a hole transport layer (HTL).

A second common layer may be disposed over the upper emission layer. The second common layer may be omitted. For example, when the first common layer and the emission layer are formed of a high molecular weight material, the second common layer may be formed. The second common layer may have a single-layer or multiple-layer structure. The second common layer may include an electron transport layer (ETL) and/or an electron injection layer (EIL). An opposite electrode may be disposed over the second common layer.

The intermediate layer 220 may further include a charge generation layer. The charge generation layer may be located between the lower emission layer and the upper emission layer.

The charge generation layer may function to supply charges to a first stack including the lower emission layer and a second stack including the upper emission layer.

The intermediate layer 220 may further include a third common layer and a fourth common layer. The third common layer may be located between the lower emission layer and the charge generation layer. The fourth common layer may be located between the charge generation layer and the upper emission layer. The third common layer may include an electron transport layer, and the fourth common layer may include a hole transport layer.

For example, the intermediate layer 220 may include a first common layer, a lower emission layer, a third common layer, a charge generation layer, a fourth common layer, an upper emission layer, and a second common layer.

A first opposite electrode 230-1 may be disposed over the first intermediate layer 220-1. A second opposite electrode 230-2 may be disposed over the second intermediate layer 220-2. That is, the first intermediate layer 220-1 may be arranged between the first pixel electrode 210-1 and the first opposite electrode 230-1, and the second intermediate layer 220-2 may be arranged between the second pixel electrode 210-2 and the second opposite electrode 230-2.

As described above, the first intermediate layer 220-1 of the first organic light emitting diode OLED1 and the second intermediate layer 220-2 of the second organic light emitting diode OLED2 may include layers that are simultaneously formed of the same material through the same process. The first opposite electrode 230-1 of the first organic light emitting diode OLED1 and the second opposite electrode 230-2 of the second organic light emitting diode OLED2 may be simultaneously formed of the same material through the same process.

Particularly, the layers may be formed by depositing a material for forming the layers on the entire surface of the substrate. A leakage current may flow between the first organic light emitting diode OLED1 and the second organic light emitting diode OLED2 through the layers.

For example, it may be assumed that the first organic light emitting diode OLED1 emits green light and the second organic light emitting diode OLED2 emits red light. Even when it is intended to supply a current only to the first organic light emitting diode OLED1 emitting green light, a current may also be supplied to the second organic light emitting diode OLED2 by integrally formed layers.

As a result, because not only green light is emitted from the first organic light emitting diode OLED1 but also red light is emitted from the second organic light emitting diode OLED2, the color purity may be degraded.

However, in the case of the display apparatus 1 according to the present embodiment, as described above, by adjusting the first angle a1 of the pixel definition layer PDL, the second angle a2 of the spacer SPC, and the arrangement relationship between the pixel definition layer PDL and the spacer SPC, the integrally formed layers may be disconnected from each other in an area other than the connection area CA. That is, an electrical signal may only be transmitted through the connection area CA and a leakage current may be prevented or reduced.

Referring to FIG. 5, a pixel definition layer PDL may be disposed over the planarization layer 208. The pixel definition layer PDL may define an emission area EA which corresponds to a first opening OP1 exposing at least a portion of the pixel electrode 210.

The first opening OP1 may include a $(1\text{-}1)^{th}$ opening OP1-1 exposing at least a portion of the first pixel electrode 210-1 and a $(1\text{-}2)^{th}$ opening OP1-2 exposing at least a portion of the second pixel electrode 210-2. In an embodiment, a first angle a1 formed between the inner surface of the pixel definition layer PDL defining the first opening OP1 and the upper surface of the substrate 100 may be about 60° or more and about 130° or less.

A spacer SPC may be disposed over the pixel definition layer PDL. The spacer SPC may include a second opening OP2 exposing at least a portion of the pixel electrode 210. The second opening OP2 may include a $(2\text{-}1)^{th}$ opening OP2-1 exposing at least a portion of the first pixel electrode 210-1 and a $(2\text{-}2)^{th}$ opening OP2-2 exposing at least a portion of the second pixel electrode 210-2. A second angle a2 formed between the inner surface of the spacer SPC defining the second opening OP2 and the substrate 100 may be more than about 0° and about 80° or less.

A body portion of the spacer SPC may not be arranged in the emission area EA but may be arranged in the connection area CA as illustrated in FIG. 4. FIG. 5 represents a cross-sectional view taken along line II-II' that does not pass through the connection area CA.

As illustrated in FIG. 5, in an area other than the connection area CA, the spacer SPC may cover a portion of the upper surface of the pixel definition layer PDL. In other words, in an area other than the connection area CA, the body portion of the spacer SPC may be arranged outside the first opening OP1. Because the pixel definition layer PDL has an undercut portions not covered by the body portion of the spacer SPC, the opposite electrode 230 may have disconnected portions on the undercut portions not covered by the body portion of the spacer SPC.

In an area other than the connection area CA, the first opposite electrode 230-1 may be disconnected from the residual opposite electrode 230a disposed on the upper surface of the spacer SPC.

In an area other than the connection area CA, the first opposite electrode 230-1 may be disconnected from the second opposite electrode 230-2. Also, the first intermediate layer 220-1 and the second intermediate layer 220-2 may be disconnected from each other in areas other than the connection area CA. Accordingly, a leakage current between adjacent pixels PX may be minimized.

A residual intermediate layer 220a may include a first residual common layer, a third residual common layer, a residual charge generation layer, a fourth residual common layer, and a second residual common layer.

The residual opposite electrode 230a, the first opposite electrode 230-1, and the second opposite electrode 230-2 may be simultaneously formed of the same material through the same process. Particularly, when a material for forming the first opposite electrode 230-1 and the second opposite electrode 230-2 is deposited on the entire surface of the substrate 100, a layer formed over the spacer SPC may be the residual opposite electrode 230a. For example, the residual opposite electrode 230a may be formed over the second residual common layer.

Figure 6:
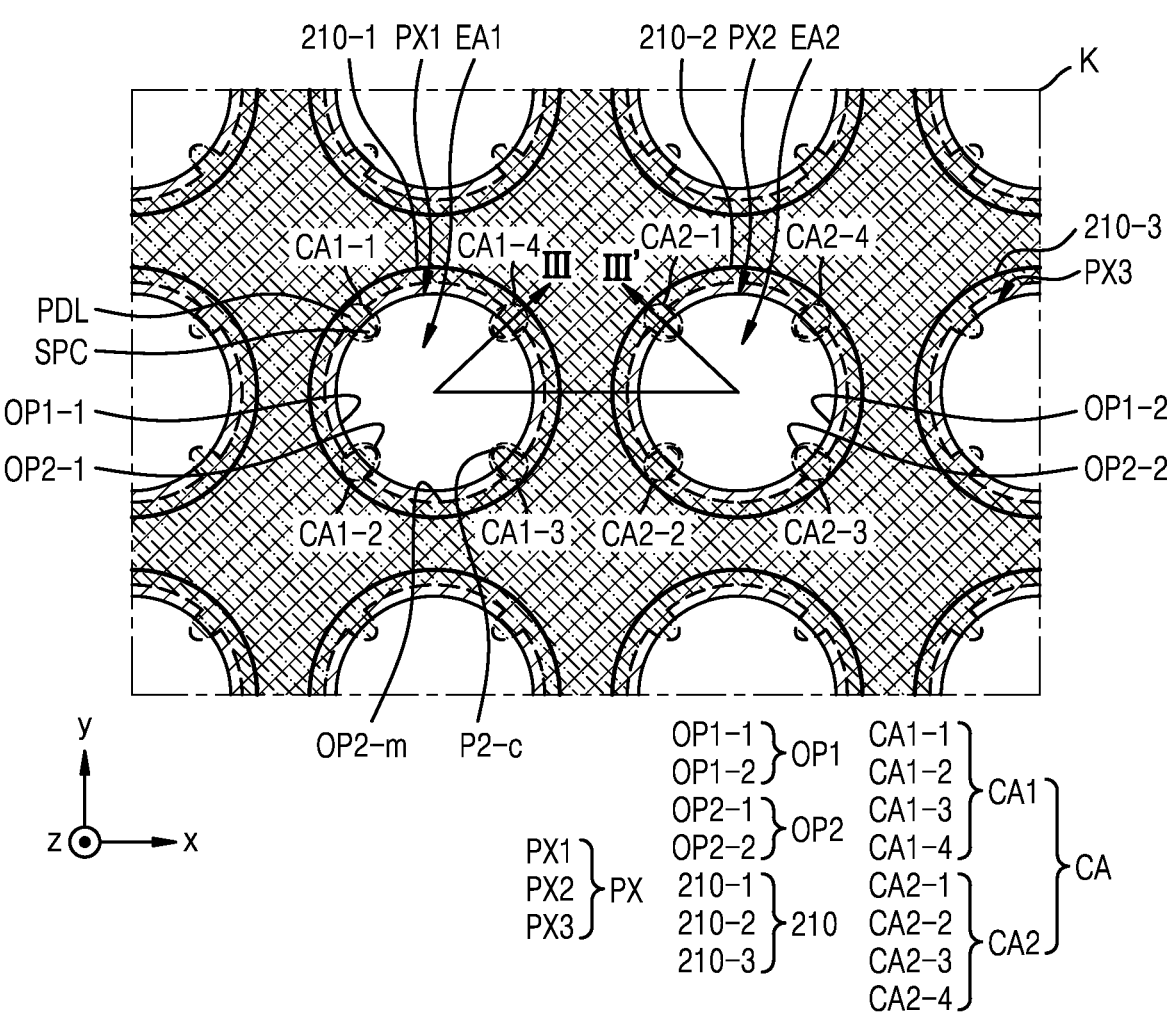
FIGS. 6, 7 and 8 are enlarged plan views schematically illustrating other embodiments that may appear in region K of the display apparatus of FIG. 1.
Figure 7:
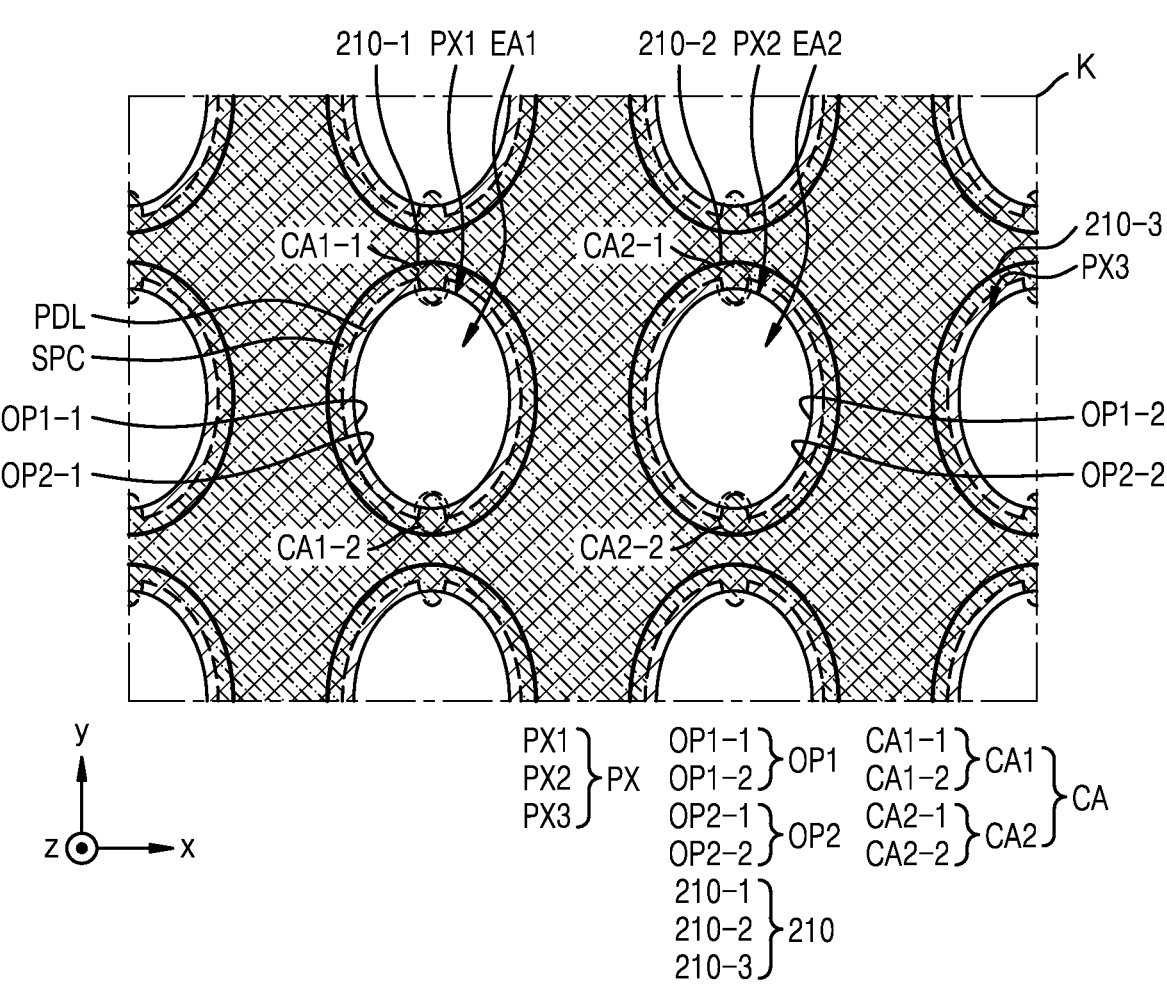
Figure 8:
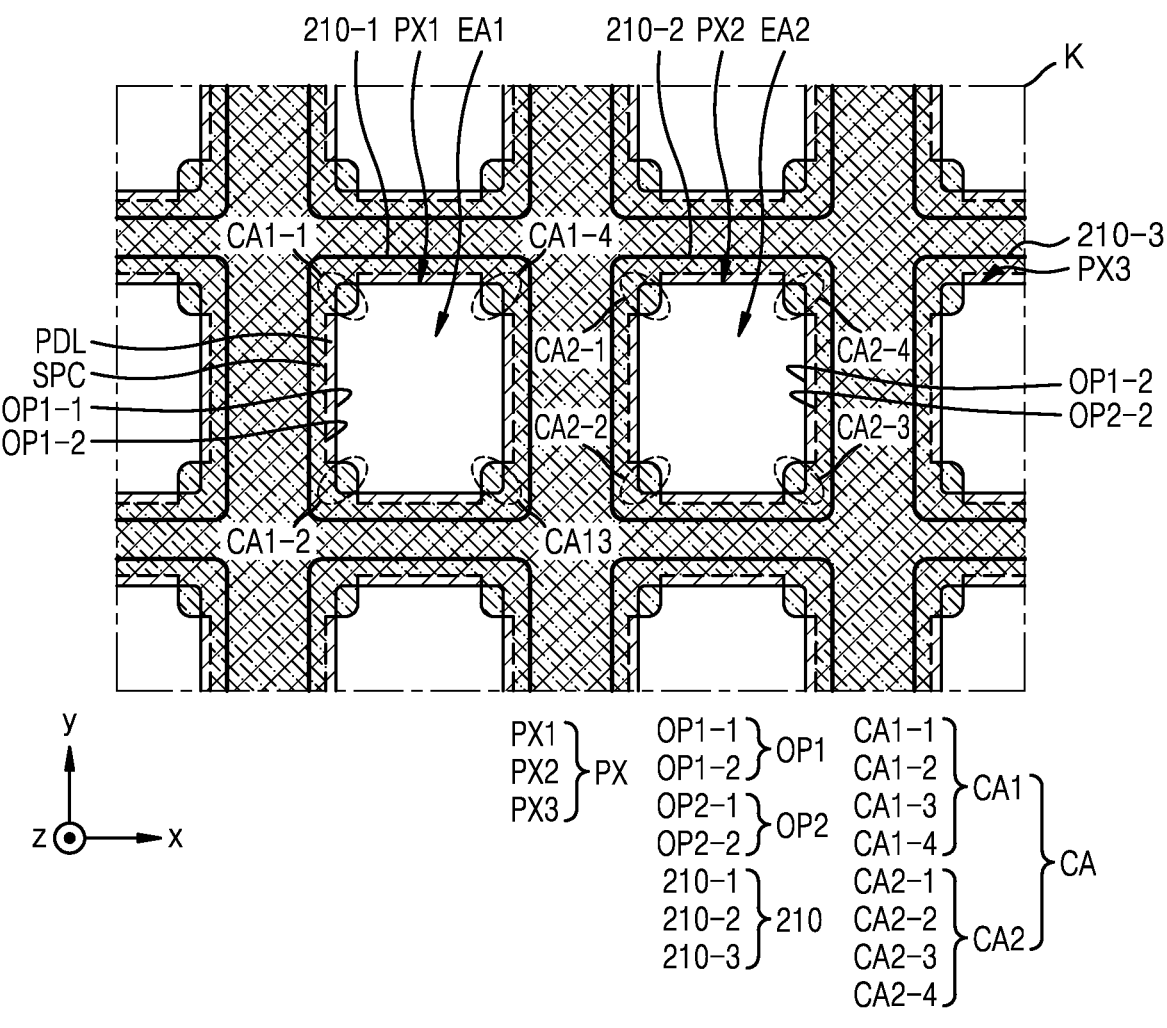

FIGS. 6, 7, and 8 are enlarged plan views schematically illustrating other embodiments that may appear in region K of the display apparatus of FIG. 1.

As illustrated in FIGS. 6 to 8, a plurality of pixels PX may be arranged in the display area DA of the substrate 100. Each of the pixels PX may refer to a subpixel and may include a display device such as an organic light emitting diode OLED. For example, the pixel PX may emit green light, red light, or blue light.

A plurality of pixel electrodes 210 may be arranged in the display area DA. The plurality of pixel electrodes 210 may include a first pixel electrode 210-1 included in the first pixel PX1, a second pixel electrode 210-2 included in the second pixel PX2, and a third pixel electrode 210-3 included in the third pixel PX3. For example, the first pixel electrode 210-1, the second pixel electrode 210-2, and the third pixel electrode 210-3 may be arranged apart from each other in the plan view. The first pixel electrode 210-1, the second pixel electrode 210-2, and the third pixel electrode 210-3 may have the same size as illustrated in FIG. 3. In other embodiments, the first pixel electrode 210-1, the second pixel electrode 210-2, and the third pixel electrode 210-3 may have different sizes. Hereinafter, the description of the third pixel PX3 will be omitted for brevity.

A pixel definition layer PDL may be disposed over the pixel electrode 210 and may include a first opening OP1 exposing at least a portion of the pixel electrode 210. The first opening OP1 may expose a central portion of the pixel electrode 210.

The pixel definition layer PDL may define an emission area EA and a connection area CA through the first opening OP1. The emission area EA may be located at a central portion of the first opening OP1. The connection area CA may be located at an edge of the first opening OP1. The emission area EA may partially overlap the connection area CA. The connection area CA may be provided as at least one connection area in one subpixel area.

Referring to FIG. 6, the first opening OP1 may have a circular shape in the plan view. Referring to FIGS. 7 and 8 together, the first opening OP1 may have an elliptical shape or a polygonal shape including a tetragonal shape in the plan view.

The first opening OP1 may include a $(1\text{-}1)^{th}$ opening OP1-1 disposed over the first pixel electrode 210-1 and a $(1\text{-}2)^{th}$ opening OP1-2 disposed over the second pixel electrode 210-2. In an embodiment, the $(1\text{-}1)^{th}$ opening OP1-1 may define a first emission area EA1 and a first connection area CA1. The $(1\text{-}2)^{th}$ opening OP1-2 may define a second emission area EA2 and a second connection area CA2.

The first connection area CA1 and the second connection area CA2 may be respectively provided as a plurality of first connection areas and a plurality of second connection areas.

Referring to FIGS. 6 and 8, the first connection area CA1 may include a $(1\text{-}1)^{th}$ connection area CA1-1, a $(1\text{-}2)^{th}$ connection area CA1-2, a $(1\text{-}3)^{th}$ connection area CA1-3, and a $(1\text{-}4)^{th}$ connection area CA1-4. Likewise, the second connection area CA2 may include a $(2\text{-}1)^{th}$ connection area CA2-1, a $(2\text{-}2)^{th}$ connection area CA2-2, a $(2\text{-}3)^{th}$ connection area CA2-3, and a $(2\text{-}4)^{th}$ connection area CA2-4.

Referring to FIG. 7, the first connection area CA1 may include a $(1\text{-}1)^{th}$ connection area CA1-1 and a $(1\text{-}2)^{th}$ connection area CA1-2, and the second connection area CA2 may include a $(2\text{-}1)^{th}$ connection area CA2-1 and a $(2\text{-}2)^{th}$ connection area CA2-2. That is, the number of connection areas that may be provided in one pixel PX may be altered as necessary.

Referring back to FIGS. 6 to 8, the $(1-1)^{th}$ opening OP1-1 and the $(1-2)^{th}$ opening OP1-2 may have the same size as illustrated. In other embodiments, the $(1-1)^{th}$ opening OP1-1 and the $(1-2)^{th}$ opening OP1-2 may have different sizes.

A spacer SPC may be disposed over the pixel definition layer PDL. The spacer SPC may be disposed over the pixel electrode 210 and may include a second opening OP2 exposing at least a portion of the pixel electrode 210. The second opening OP2 may expose a central portion of the pixel electrode 210.

In an embodiment, the second opening OP2 may include a main opening OP2-m having a circular, elliptical, or polygonal shape. The spacer SPC may have a protrusion P2-c protruding toward a center of the first opening OP1 in an area corresponding to the connection area CA. In another embodiment, the second opening OP2 may have an atypical shape.

The second opening OP2 may include a $(2-1)^{th}$ opening OP2-1 disposed over the first pixel electrode 210-1 and a $(2-2)^{th}$ opening OP2-2 disposed over the second pixel electrode 210-2. The $(2-1)^{th}$ opening OP2-1 and the $(2-2)^{th}$ opening OP2-2 may have the same size as illustrated in FIGS. 6 to 8. In other embodiments, the $(2-1)^{th}$ opening OP2-1 and the $(2-2)^{th}$ opening OP2-2 may have different sizes.

Figure 9:
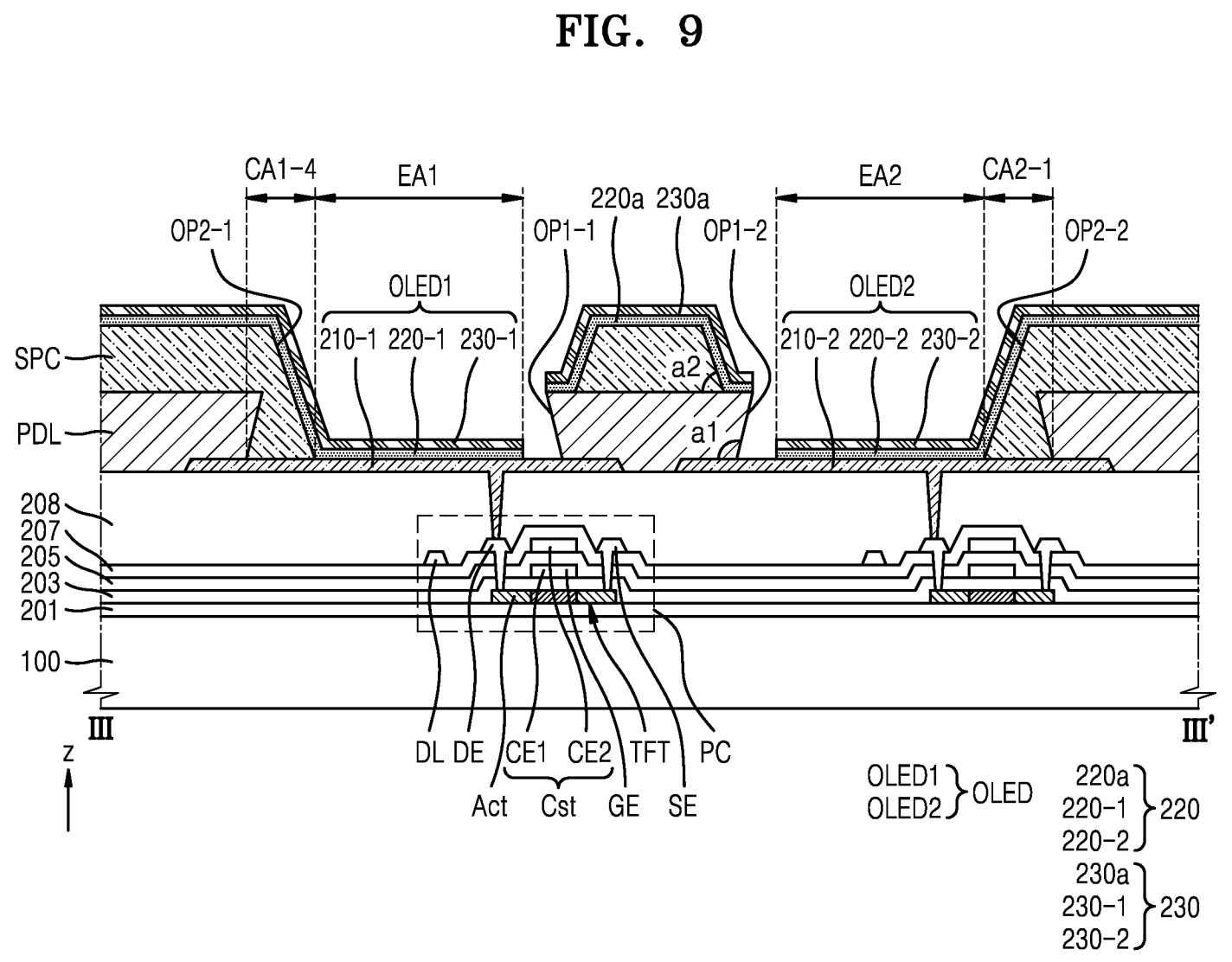

FIG. 9 is a cross-sectional view schematically illustrating a cross-section taken along line III-III' of FIG. 6. Redundant descriptions of the same configuration as that of FIGS. 4 and 5 will be omitted for brevity.

The pixel definition layer PDL disposed over the planarization layer 208 may cover at least a portion of the first pixel electrode 210-1 and at least a portion of the second pixel electrode 210-2. The pixel definition layer PDL may include a $(1-1)^{th}$ opening OP1-1 defining the first pixel PX1 and a $(1-2)^{th}$ opening OP1-2 defining the second pixel PX2. The $(1-1)^{th}$ opening OP1-1 may define a first emission area EA1 and a $(1-4)^{th}$ connection area CA1-4. The $(1-2)^{th}$ opening OP1-2 may define a second emission area EA2 and a $(2-1)^{th}$ connection area CA2-1.

The first emission area EA1 may include a central portion of the $(1-1)^{th}$ opening OP1-1. The second emission area EA2 may include a central portion of the $(1-2)^{th}$ opening OP1-2. The $(1-4)^{th}$ connection area CA1-4 may be located at an edge of the $(1-1)^{th}$ opening OP1-1. The $(2-1)^{th}$ connection area CA2-1 may be located at an edge of the $(1-2)^{th}$ opening OP1-2.

The spacer SPC may be disposed over the pixel definition layer PDL. The spacer SPC may include a $(2-1)^{th}$ opening OP2-1 exposing at least a portion of the first pixel electrode 210-1 and a $(2-2)^{th}$ opening OP2-2 exposing at least a portion of the second pixel electrode 210-2.

The first intermediate layer 220-1 may be disposed over the first pixel electrode 210-1. The second intermediate layer 220-2 may be disposed over the second pixel electrode 210-2. The first opposite electrode 230-1 may be disposed over the first intermediate layer 220-1. The second opposite electrode 230-2 may be disposed over the second intermediate layer 220-2.

In an embodiment, a first angle a1 formed between the inner surface of the pixel definition layer PDL defining the first opening OP1 and the upper surface of the substrate 100 may be greater than a second angle a2 formed between the inner surface of the spacer SPC defining the second opening OP2 and the substrate 100. The first angle a1 may be about 60° or more and about 130° or less. The second angle a2 may be more than about 0° and about 80° or less.

In the $(1-4)^{th}$ connection area CA1-4, the body portion of the spacer SPC may be arranged in the $(1-1)^{th}$ opening OP1-1. In the $(2-1)^{th}$ connection area CA2-1, the body portion of the spacer SPC may be arranged in the $(1-2)^{th}$ opening OP1-2. The body portion of the spacer SPC may be arranged in the connection opening OP1-c of the first opening OP1. In the $(1-4)^{th}$ connection area CA1-4 and the $(2-1)^{th}$ connection area CA2-1, the body portion of the spacer SPC may cover the side surface of the pixel definition layer PDL.

The second angle a2 of the spacer SPC may be less than the first angle a1 of the pixel definition layer PDL. Because the second angle a2 may be more than about 0° and about 80° or less, the first intermediate layer 220-1 and the first opposite electrode 230-1 may cover the side surface of the spacer SPC. The first intermediate layer 220-1 and the first opposite electrode 230-1 may be connected in the $(1-4)^{th}$ connection area CA1-4 to the intermediate layer 220 and the opposite electrode 230 of an adjacent area. The second intermediate layer 220-2 and the second opposite electrode 230-2 may be connected in the $(2-1)^{th}$ connection area CA2-1 to the intermediate layer 220 and the opposite electrode 230 of an adjacent area.

The body portion of the spacer SPC may not be arranged in the first emission area EA1 and the second emission area EA2. Referring to FIG. 9, in an area other than the connection area CA, the first intermediate layer 220-1 and the first opposite electrode 230-1 may be disconnected from the residual intermediate layer 220a and the residual opposite electrode 230a over the spacer SPC. Likewise, the second intermediate layer 220-2 and the second opposite electrode 230-2 may be disconnected from the residual intermediate layer 220a and the residual opposite electrode 230a over the spacer SPC. Accordingly, the first intermediate layer 220-1 and the first opposite electrode 230-1 may be respectively disconnected from the second intermediate layer 220-2 and the second opposite electrode 230-2. Accordingly, a leakage current due to the intermediate layer 220 and the opposite electrode 230 may be minimized.

In summary, according to an embodiment, the flow of a current may be secured by connecting the intermediate layer 220 and the opposite electrode 230 between adjacent pixels PX in the connection area CA, and a leakage current may be minimized by separating the intermediate layer 220 and the opposite electrode 230 between adjacent pixels PX in an area other than the connection area CA. Accordingly, the display apparatus 1 of the disclosure may effectively transmit an electrical signal.

Because the organic light emitting diodes OLED may be easily damaged by the moisture or oxygen from the outside, an encapsulation layer (not illustrated) may be arranged to cover and protect the organic light emitting diodes OLED. The encapsulation layer may include a first inorganic encapsulation layer, an organic encapsulation layer, and a second inorganic encapsulation layer and may cover the display area DA and extend to the outside of the display area DA.

According to an embodiment described above, a display apparatus capable of minimizing process steps while reducing a leakage current between adjacent display devices may be implemented. However, the scope of the disclosure is not limited to these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate;
a pixel electrode disposed over the substrate;
a pixel definition layer including a first opening exposing at least a portion of the pixel electrode, the exposed portion of the pixel electrode including an emission area and a connection area;
a spacer disposed over the pixel definition layer and including a second opening exposing at least a portion of the pixel electrode;
an emission layer arranged in the emission area; and
an opposite electrode disposed over the emission layer and covering at least a portion of the spacer and the pixel definition layer,
wherein at least a portion of a body portion of the spacer is disposed in the first opening to cover a side surface of the pixel definition layer, and
wherein, in an area other than the connection area, the opposite electrode disposed over the emission layer is disconnected from the opposite electrode disposed on an upper surface of the spacer.

2. The display apparatus of claim 1, wherein the body portion of the spacer is not arranged in the emission area and is arranged in the connection area.

3. The display apparatus of claim 2, wherein, in the connection area, the opposite electrode covers a side surface of the second opening, and
wherein the opposite electrode disposed over the emission layer is connected through the connection area to the opposite electrode disposed on an upper surface of the spacer.

4. The display apparatus of claim 1, wherein a first angle formed between an inner surface of the pixel definition layer defining the first opening and an upper surface of the substrate is about 60° or more and about 130° or less, and a second angle formed between an inner surface of the spacer defining the second opening and the upper surface of the substrate is more than about 0° and about 80° or less.

5. The display apparatus of claim 1, wherein the first opening includes a main opening having a polygonal shape corresponding to the emission area and a connection opening protruding from a corner of the polygonal shape in an area corresponding to the connection area.

6. The display apparatus of claim 1, wherein the first opening has a circular or polygonal shape in a plan view.

7. The display apparatus of claim 6, wherein the second opening includes a main opening having a circular or polygonal shape, and
wherein the spacer includes a protrusion protruding toward a center of the first opening in an area corresponding to the connection area.

8. The display apparatus of claim 1, wherein the connection area is located at an edge of the first opening.

9. The display apparatus of claim 1, wherein one subpixel area includes at least one connection area.

10. The display apparatus of claim 1, wherein the spacer and the pixel definition layer include different materials.

11. A display apparatus comprising:
a first pixel electrode and a second pixel electrode arranged apart from each other over a substrate;
a pixel definition layer including a $(1\text{-}1)^{th}$ opening exposing at least a portion of the first pixel electrode to define a first emission area and a first connection area, and a $(1\text{-}2)^{th}$ opening exposing at least a portion of the second pixel electrode to define a second emission area and a second connection area;
a spacer disposed over the pixel definition layer and including a $(2\text{-}1)^{th}$ opening exposing at least a portion of the first pixel electrode and a $(2\text{-}2)^{th}$ opening exposing at least a portion of the second pixel electrode;
a first emission layer arranged in the first emission area and a second emission layer arranged in the second emission area; and
an opposing electrode disposed over the first emission layer and the second emission layer and at least partially covering the pixel definition layer and the spacer,
wherein at least a portion of a body portion of the spacer is arranged in the (1-1)th opening and the (1-2)th opening, an inner surface of the pixel definition layer defining the (1-1)th opening and the (1-2)th opening forms an obtuse angle with an upper surface of the substrate, and an inner surface of the spacer defining the (2-1)th opening and the (2-2)th opening forms an acute angle with the upper surface of the substrate, and
wherein, in an area other than the first connection area and the second connection area, the opposite electrode disposed over the first pixel electrode and the opposite electrode disposed over the second pixel electrode are disconnected.

12. The display apparatus of claim 11, wherein the body portion of the spacer is arranged in the first connection area and the second connection area.

13. The display apparatus of claim 12, wherein, through the first connection area and the second connection area, the opposite electrode disposed over the first pixel electrode is connected to the opposite electrode disposed over the second pixel electrode.

14. The display apparatus of claim 11, wherein the first connection area is located at an edge of the $(1\text{-}1)^{th}$ opening, and the second connection area is located at an edge of the $(1\text{-}2)^{th}$ opening.

15. The display apparatus of claim 11, wherein the first connection area includes at least one first connection area disposed over the first pixel electrode, and the second connection area includes at least one second connection area disposed over the second pixel electrode.

16. The display apparatus of claim 11, wherein each of the $(1\text{-}1)^{th}$ opening and the $(1\text{-}2)^{th}$ opening includes a main opening having a polygonal shape corresponding to the first emission area and the second emission area, respectively, and a connection opening protruding from a corner of the polygonal shape corresponding to the first connection area and the second connection area toward a direction away from a center of each of the $(1\text{-}1)^{th}$ opening and the $(1\text{-}2)^{th}$ opening, respectively.

17. The display apparatus of claim 11, wherein the $(1\text{-}1)^{th}$ opening and the $(1\text{-}2)^{th}$ opening have a circular or polygonal shape.

18. The display apparatus of claim 11, wherein the spacer and the pixel definition layer include different materials.

* * * * *